United States Patent [19]

Maruyama et al.

[11] Patent Number: 5,898,339
[45] Date of Patent: Apr. 27, 1999

[54] FEEDFORWARD AMPLIFIER

[75] Inventors: Satoshi Maruyama; Tokihiro Miyo; Fumihiko Kobayashi; Akira Seino, all of Kawasaki, Japan

[73] Assignee: Fujitsu Limited, Kawasaki, Japan

[21] Appl. No.: 08/912,687

[22] Filed: Aug. 18, 1997

[30] Foreign Application Priority Data

Feb. 20, 1997 [JP] Japan .................. 9-036251

[51] Int. Cl.$^6$ ........................... H03F 1/26
[52] U.S. Cl. ........................... 330/151; 330/149
[58] Field of Search ................. 330/149, 151, 330/52

[56] References Cited

U.S. PATENT DOCUMENTS 5,455,537 10/1995 Larkin et al. ............... 330/52
5,515,000 5/1996 Maruyama et al. .......... 330/52

FOREIGN PATENT DOCUMENTS 1-198809 8/1989 Japan.

Primary Examiner—Robert Pascal
Assistant Examiner—Patricia Nguyen
Attorney, Agent, or Firm—Staas & Halsey

[57] ABSTRACT

A feedforward amplifier having a distortion detection loop and a distortion elimination loop is provided that achieves increased accuracy, improved response, and stable operation. A variable attenuator is placed in front of a detector in a loop output stage, and the amount of attenuation in the variable attenuator is set large during a transient response period during the rising of the amplifier, and set small during a steady-state condition. The detection of the transition to the steady-state condition is accomplished, for example, by comparing the detector output with a prescribed threshold value. The width of perturbation is set large during a transient response period, and set small during a steady-state condition.

9 Claims, 10 Drawing Sheets

FEEDFORWARD AMPLIFIER

BACKGROUND OF THE INVENTION

1. Field of the Invention

The present invention relates to a feedforward amplifier in which distortion arising due to the nonlinearity of an amplifier is detected in a distortion detection loop and the distortion is cancelled in a distortion elimination loop by using the detected distortion. This kind of amplifier is particularly effective for the cancellation of distortion arising in a multi-carrier amplifier where multiple carriers are simultaneously amplified by using a single amplifier, such as a transmit amplifier used, for example, in a base station of a digital mobile telephone system.

2. Description of the Related Art

In a feedforward amplifier having a distortion detection loop and a distortion elimination loop, the distortion detection loop detects distortion components by combining a portion of the input to an amplifier and a portion of the output from the same amplifier after adjusting their phase and amplitude so that they are opposite in phase and equal in amplitude to each other with regard to the main signal, and the distortion elimination loop cancels the distortion components contained in the output of the amplifier by combining the output of the distortion detection loop with the output of the amplifier after adjusting their phase and amplitude so that they are opposite in phase and equal in amplitude to each other with regard to the distortion. To compensate for changes over time in the amount of attenuation and the amount of phase shifting in a variable attenuator and a variable phase shifter used to provide the opposite phase with equal amplitude, the main signal and a pilot signal inserted at an appropriate point for detection of loop equilibrium are detected from the respective outputs of the distortion detection loop and distortion elimination loop, and the variable attenuator and variable phase shifter in each loop are automatically controlled to minimize the respective amounts. For automatic control of the amount of attenuation and amount of phase shifting in each loop, a perturbation method is employed in which each parameter is changed in a steplike manner with a specified periodicity and with a prescribed perturbation width, the change being continued in the same direction if an improvement is obtained and being reversed in the opposite direction if the situation worsens, thereby finding optimum values.

A detector for detecting the main signal in the distortion detection loop and a detector for detecting loop equilibrium in the distortion elimination loop are each designed with an input dynamic range that is usually determined by considering the largest and smallest input levels that can occur. Further, for the perturbation step width, a sufficiently small step width is usually employed so that the required accuracy (the amount of cancellation) can be obtained.

If, of the above detectors, the detector for detecting the main signal in the distortion detection loop is taken as an example, its input level becomes the largest when the number of carriers contained in the input to the amplifier is the largest and the power of each carrier is also the largest, and when the input and output of the amplifier are combined in phase with regard to the main signal, and becomes the smallest when the number of carriers and the carrier power are both the smallest and when the amplifier input and outputs are combined in opposite phase and equal amplitude with regard to the main signal; therefore, the dynamic range at the input to the detector is wide, for example, 50 dB or more. Accordingly, determining the input dynamic range by considering the largest and smallest possible levels as in the prior art involves the problem that when the number of carriers and the carrier power are small, minutes changes in detection amount near optimum values cannot be detected and deviations from the optimum amplitude and phase values become large, making it impossible to provide a sufficient cancellation amount. If the input range is determined by giving priority to accuracy at the minimum input level, then the detector will saturate and control will become unstable when the number of carriers and the carrier power are large.

For the perturbation step width, if the step width is set small for high accuracy as in the prior art, there arises the problem that it takes time from the moment the control is initiated until the control settles down. Furthermore, if the perturbation width is small, there arises the further problem that the perturbation tends to be performed in the wrong direction because of modulation-induced input signal variations, noise, etc. This also results in unstable control.

The above-outlined problems also apply to the distortion elimination loop.

SUMMARY OF THE INVENTION

It is accordingly an object of the present invention to resolve the above-outlined problems and to provide a feedforward amplifier that operates stably with high accuracy and with a high response speed.

According to the present invention, there is provided a feedforward amplifier comprising: an amplifier; a distortion detection loop for combining a portion of an input to the amplifier with a portion of an output from the amplifier after adjusting the amplitude and phase of either one of them so that they are opposite in phase and equal in amplitude to each other with respect to a main signal, and for thereby outputting essentially only distortion generated by the amplifier, the distortion detection loop including a detector for detecting the main signal contained in the output thereof in order to adjust the amplitude and phase; a distortion elimination loop for combining the output of the distortion detection loop with the other portion of the output from the amplifier after adjusting the amplitude and phase of either one of them so that they are opposite in phase and equal in amplitude to each other with respect to the distortion, and for thereby substantially eliminating the distortion from the output of the amplifier, the distortion eliminating loop including a detector for detecting loop equilibrium in order to adjust the amplitude and phase; a variable attenuator placed in front of the detector in at least either one of the distortion detection and distortion elimination loops; and a control circuit for varying an amount of attenuation in the variable attenuator in accordance with a control condition of the corresponding loop.

According to the present invention, there is also provided a feedforward amplifier comprising: an amplifier; a distortion detection loop for combining a portion of an input to the amplifier with a portion of an output from the amplifier after adjusting the amplitude and phase of either one of them so that they are opposite in phase and equal in amplitude to each other with respect to a main signal, by varying the amplitude and phase of either one of them by a prescribed perturbation width and finding optimum values, and for thereby outputting essentially only distortion generated by the amplifier; a distortion elimination loop for combining the output of the distortion detection loop with the other portion of the output from the amplifier after adjusting the amplitude and phase of either one of them so that they are opposite in phase and equal in amplitude to each other with respect to the distortion, by varying the amplitude and phase of either one of them by a prescribed perturbation width and finding optimum values, and for thereby substantially eliminating the distortion from the output of the amplifier; and a control circuit for varying the perturbation width in at least either one of the distortion detection and distortion elimination loops in accordance with a control condition of that loop.

DESCRIPTION OF THE PREFERRED EMBODIMENTS

Figure 1:
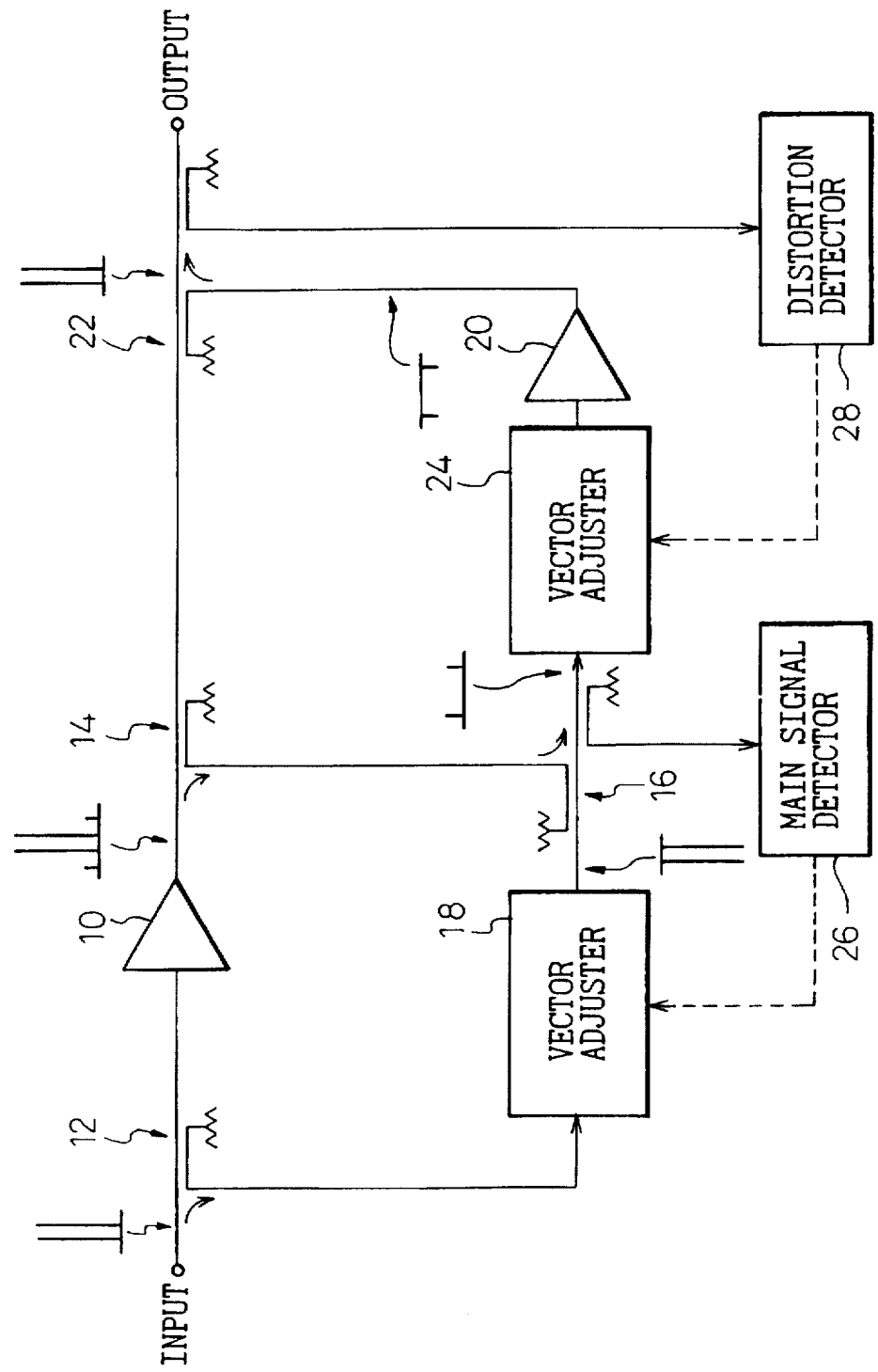
FIG. 1 is a block diagram of a feedforward amplifier.

FIG. 1 is a block diagram showing one example of a feedforward amplifier. Shown near each signal line in the figure is a frequency spectrum at the corresponding portion in the case of a two-carrier system.

A portion of the signal at the input side of an amplifier 10 and a portion of the signal at the output side thereof are separated by respective directional couplers 12 and 14. The amplitude and phase of the separated signal at the input side are adjusted by a vector adjuster 18 so that the signal, when combined in a directional coupler 16 with the separated signal at the output side, will be opposite in phase and equal in amplitude to each other with regard to the main signal; the separated signal at the input side is thus combined in the directional coupler 16 with the separated signal at the output side, to obtain the distortion components resulting from the nonlinearity of the amplifier 10.

The amplitude and phase of the thus obtained distortion components are adjusted by a vector adjuster 24 so that the distortion components, when amplified by an auxiliary amplifier 20 and combined in a directional coupler 22 with the output signal of the amplifier 10, will be opposite in phase and equal in amplitude; the distortion components are thus amplified by the auxiliary amplifier 20 and combined in the directional coupler 22 with the output of the amplifier 10. The result is an output free from the distortion arising from the nonlinearity of the amplifier 10.

The loop containing the vector adjuster 18 is called a distortion detection loop, while the loop containing the vector adjuster 24 is called a distortion elimination loop. The vector adjusters 18 and 24 are each constructed from a series connection of a variable attenuator and a variable phase shifter. Whether the signals combined in the distortion detection loop are opposite in phase and equal in amplitude is determined based on whether or not a signal at the main signal frequency is detected from the output of the distortion detection loop by a main signal detector 26; likewise, the decision on the opposite phase and equal amplitude in the distortion elimination loop is made by inserting a pilot signal in the input or output of the amplifier 10 and by determining whether or not the pilot signal indicating the equilibrium condition of the distortion detection loop is detected from the output of the distortion elimination loop by a distortion detector 28. The amount of attenuation and the amount of phase shift in the vector adjusters 18 and 24 are changed independently of each other at prescribed intervals of time and with a prescribed perturbation width; the change is continued in the same direction if the detected amount decreases, and reversed in the opposite direction if it increases, and a point where it changes from decreasing to increasing is taken as the optimum value.

The feedforward amplifier of the present invention will be explained below, focusing on the distortion detection loop (the main signal detector), but essentially the same explanation applies for the distortion elimination loop (the distortion detector). Therefore, the following explanation includes the case where the present invention is applied to the distortion detection loop or the distortion elimination loop, and the case where the present invention is applied to both.

Figure 2:
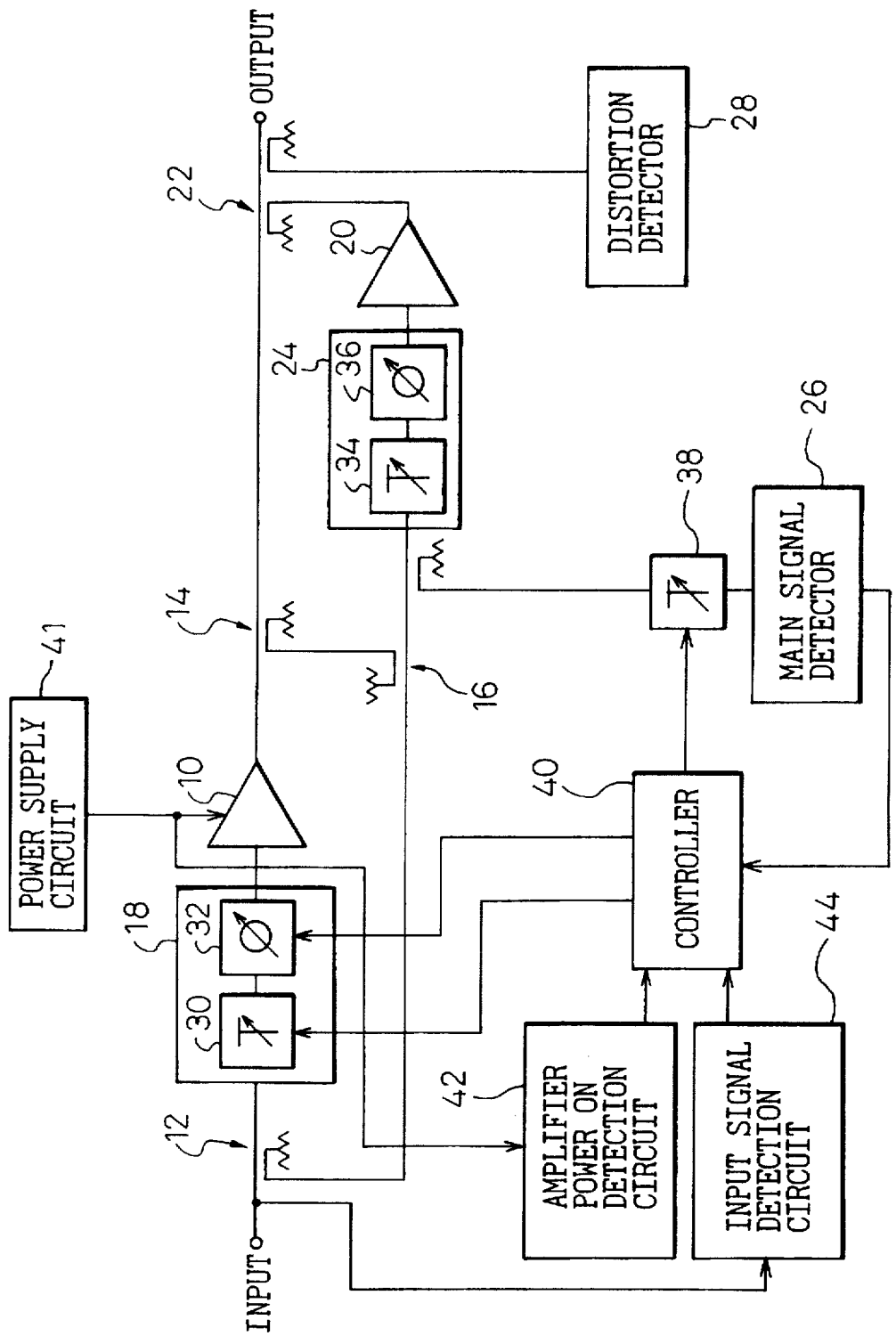
FIG. 2 is a block diagram showing one specific example of the feedforward amplifier of the present invention.

FIG. 2 is a block diagram showing a first example of the feedforward amplifier of the present invention. The same component elements as those in FIG. 1 are designated by the same reference numerals. In FIG. 2, the vector adjuster 18 is located on the amplifier 10 side. A controller 40 adjusts the variable attenuator 30 and variable phase shifter 32 by a perturbation method in accordance with the detection output of the main signal detector 26. For simplicity, the corresponding block for adjusting the variable attenuator 34 and variable phase shifter 36 by the perturbation method in accordance with the detection output of the distortion detector 28 is not shown here.

In the first example of the feedforward amplifier of the present invention, a variable attenuator 38 is placed in front of the main signal detector 26 which detects the main signal contained in the output of the distortion detection loop, and the controller 40 varies the amount of attenuation in the variable attenuator 38 in accordance with a detection output of an amplifier power ON detection circuit 42 for detecting power ON from a power supply circuit 41 that supplies power to the amplifier 10, a detection output of an input signal detection circuit 44 for detecting the presence or absence of an input signal, and a detection output of the main signal detector 26.

Figure 3:
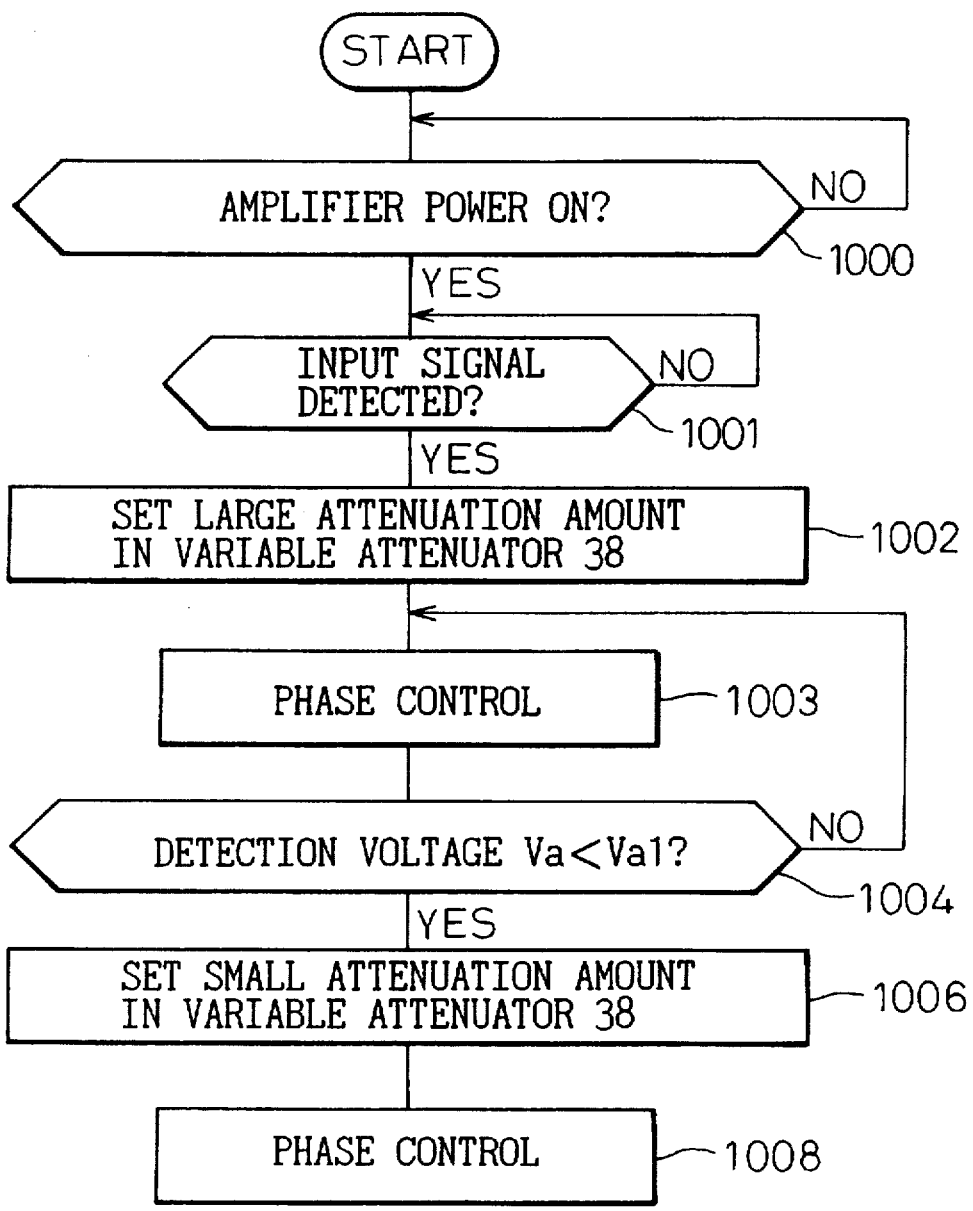
FIG. 3 is a flowchart illustrating the operation of a controller 40 in FIG. 2.

FIG. 3 is a flowchart illustrating the operation of the controller 40. In step 1000, it is determined, based on the output of the amplifier power ON detection circuit 42, whether the power to the amplifier 10 is ON or not. If it is determined that the power to the amplifier 10 is ON, then in step 1001 it is determined, based on the output of the input signal detection circuit 44, whether or not a signal is input to the amplifier 10. If it is determined that a signal is input to the amplifier 10, a large amount of attenuation is set in the variable attenuator 38 in step 1002. In this condition, in step 1003 the variable attenuator 30 and the variable phase shifter 32 are controlled by the perturbation method. As the set values of the variable attenuator 30 and the variable phase shifter 32 approach their optimum values, detection voltage Va of the main signal detector 26 decreases. If the detection voltage Va drops below a threshold value Va1 in step 1004, then in step 1006 a small attenuation amount is set in the variable attenuator 38, and with this value, the amplitude and phase are controlled in step 1008.

Figure 4:
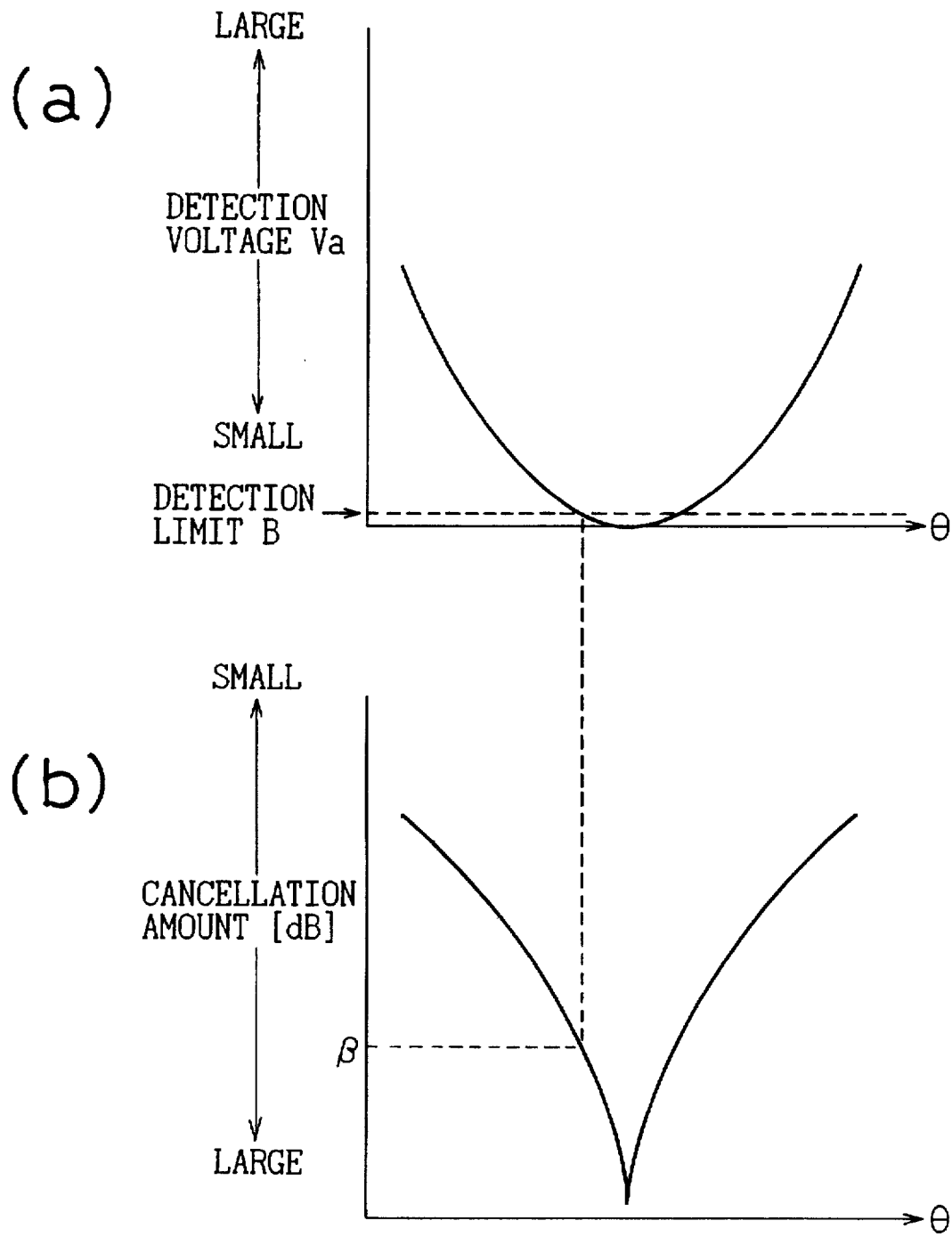
FIG. 4 is a graph showing how detection voltage and the amount of cancellation change with the change of the amount of phase shift in a prior art feedforward amplifier.

FIG. 4 shows how the detection voltage (part (a): voltage scale) and the amount of main signal cancellation (part (b): decibel scale) in the distortion detection loop change with the change of the amount of phase shift θ in the variable phase shifter 32 when the amount of attenuation in the attenuator 38 is not changed even if the detection voltage decreases (this arrangement corresponds to the prior art). For the amplitude, it is assumed that the amount of attenuation in the variable attenuator 38 is set to an optimum value. As can be seen from FIG. 4, in the arrangement where the amount of attenuation in the attenuator 38 is not changed, if the amount of cancellation becomes greater than β decibels, the detection voltage drops below a minimum detection level of B volts and the change cannot be detected. As a result, the amount of cancellation cannot be set stably above β. Here, the minimum detection level is determined, for example, by the minimum resolution of an A/D converter.

Figure 5:
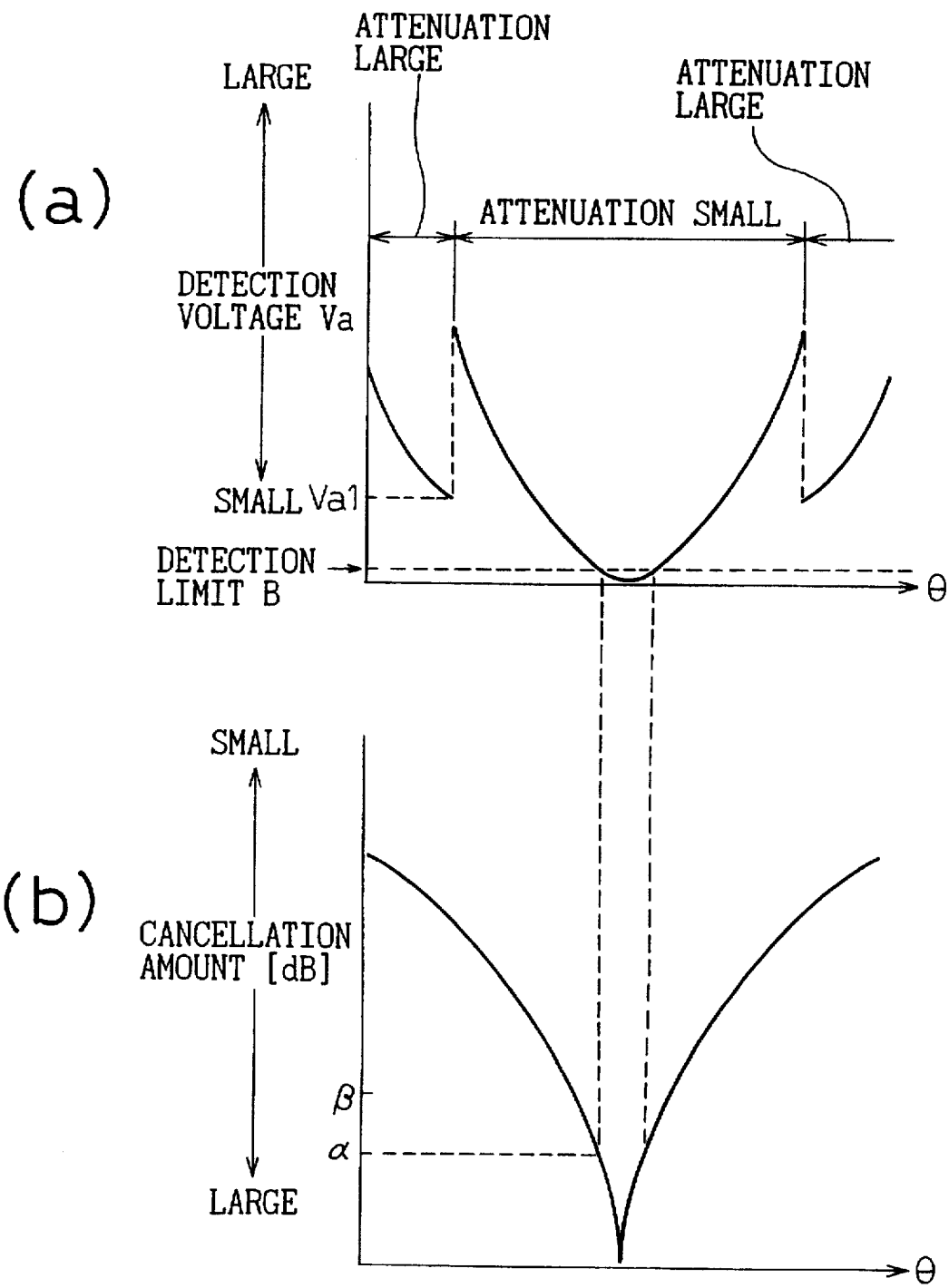
FIG. 5 is a graph showing how detection voltage and the amount of cancellation change with the change of the amount of phase shift in the feedforward amplifier of FIGS. 2 and 3.

On the other hand, when the amount of attenuation in the variable attenuator 38 is set to a smaller value as the detection voltage Va drops below Va1 in accordance with the present invention, the amount of cancellation corresponding to the detection limit of B volts increases to α greater than β, as shown in FIG. 5. This permits a greater amount of cancellation a to be achieved stably. The description above also applies to the adjustment of the amplitude.

In the example of the feedforward amplifier of the present invention described with reference to FIGS. 2 and 3 and also in the examples hereinafter described, detection of the rising of the input signal to the amplifier in the input signal detection circuit 44 is accomplished, for example, by separating a portion of the input signal at the input side of the amplifier 10 and supplying it to the detection circuit, as shown in FIG. 2. Instead of detecting the input signal, it may be configured to detect the output signal from the amplifier. Further, in the initial condition, since the adjustments of the variable attenuator 30 and variable phase shifter 32 are not sufficient, and since the output of the main signal detector 26 is expected to increase as the input signal rises, the main signal detector 26 can be used to detect the rising of the input signal. Furthermore, in cases where the input signal to the amplifier is expected to rise upon the power ON of the amplifier or to have risen by that time, the provision of the input signal detection circuit 44 and the processing in step 1001 are not necessary. As another variant, since it can be expected that the loop control stabilizes and the amplitude and phase are brought close to optimum values when a certain length of time has elapsed after the rising of the power and input signal to the amplifier, the amount of attenuation in the variable attenuator 38 may be changed when a prescribed length of time has elapsed after the rising of the power and input signal to the amplifier, instead of changing it when the detected voltage Va drops below the threshold value Va1. In the example shown in FIG. 2, the variable attenuator 38 is placed in front of the main signal detector 26 used to adjust the distortion detection loop, but instead of, or in addition to, this the variable attenuator may be provided in front of the distortion detector 28 used to adjust the distortion elimination loop.

Figure 6:
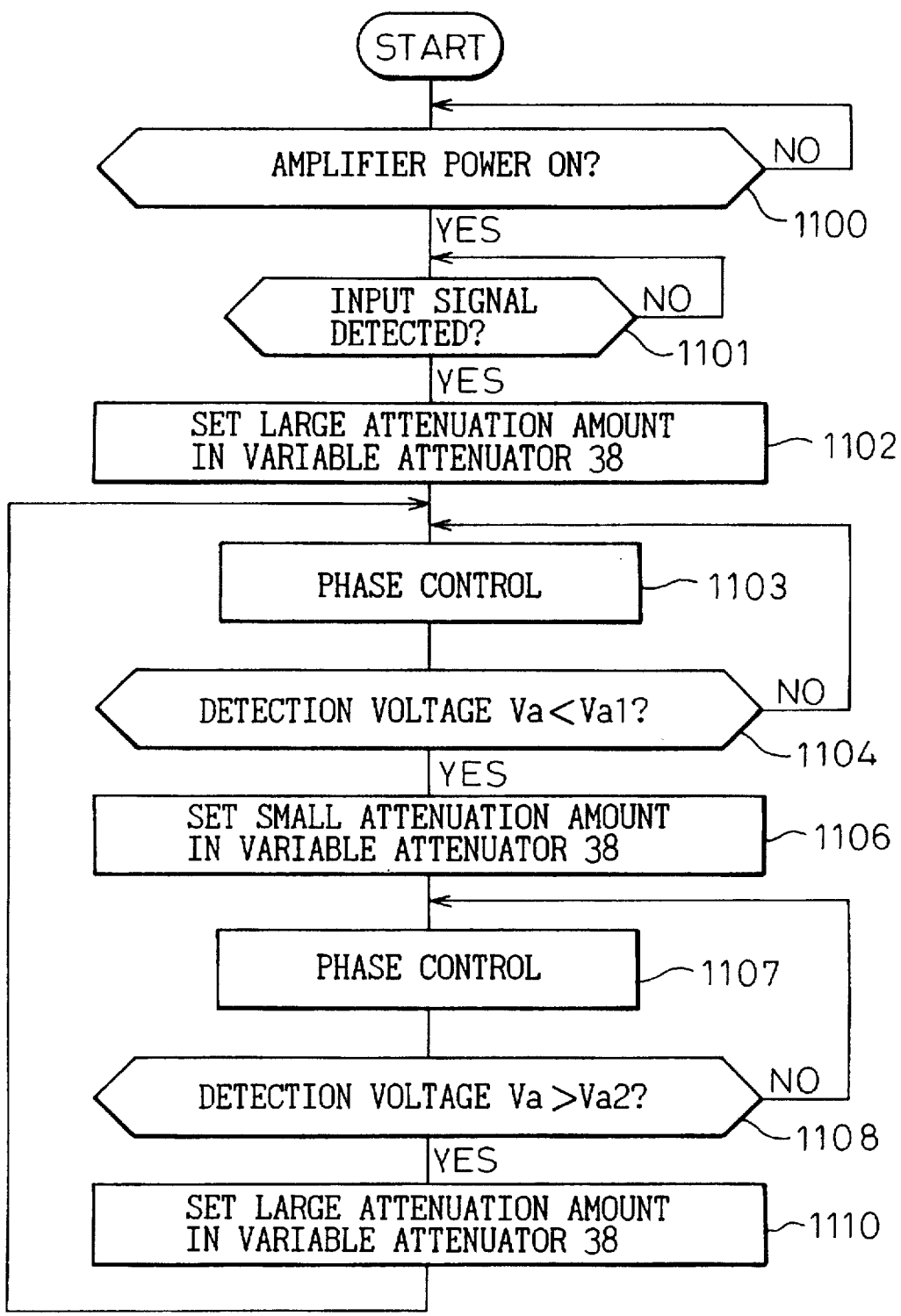
FIG. 6 is a flowchart illustrating the operation of the controller 40 in another example of the feedforward amplifier of the present invention.

FIG. 6 is a flowchart illustrating the operation of the controller 40 in another example of the feedforward amplifier of the present invention. The processing in steps 1100 to 1106 is the same as the processing in steps 1000 to 1006 in FIG. 3. After setting the amount of attenuation in the variable attenuator 38 to a small value in step 1106, it is determined in step 1108 whether or not the detection voltage Va is greater than a second threshold value Va2. If it is determined that Va is greater than Va2, then in step 1110 the amount of attenuation in the variable attenuator 38 is set back to a large value, after which the process returns to step 1104.

Figure 7:
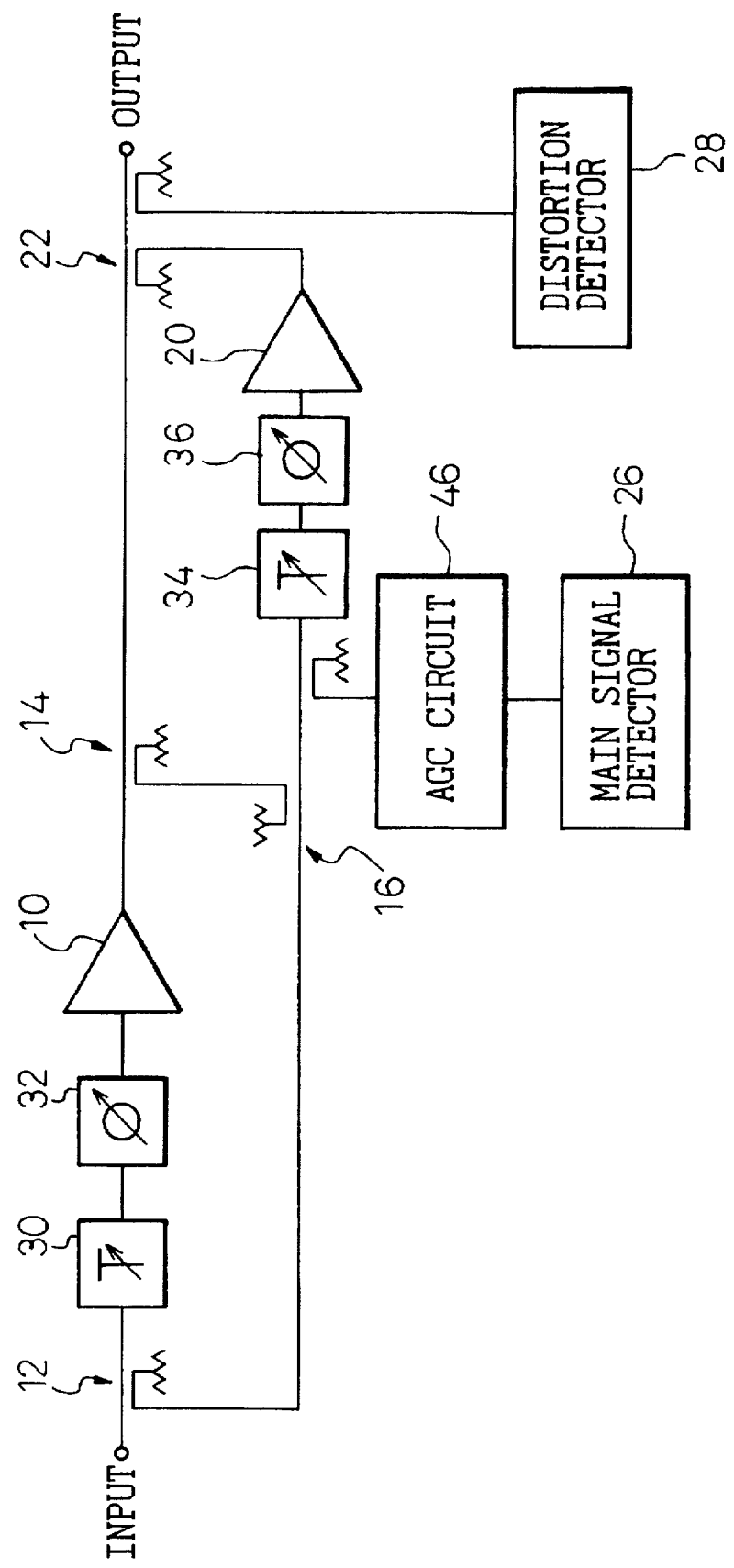
FIG. 7 is a block diagram showing a further example of the feedforward amplifier of the present invention.

FIG. 7 shows a further example of the feedforward amplifier of the present invention. In the feedforward amplifier of FIG. 7, an AGC circuit 46 is inserted in front of the main signal detector 26. The AGC circuit 46 preferably includes a series connection of a variable attenuator and an amplifier, the amount of attenuation in the variable attenuator being continuously controlled to maintain its output voltage at a constant level. The time constant of the AGC circuit 46 is set just long enough to enable changes in the main signal detection voltage, by the perturbation method, to be detected.

Figure 8:
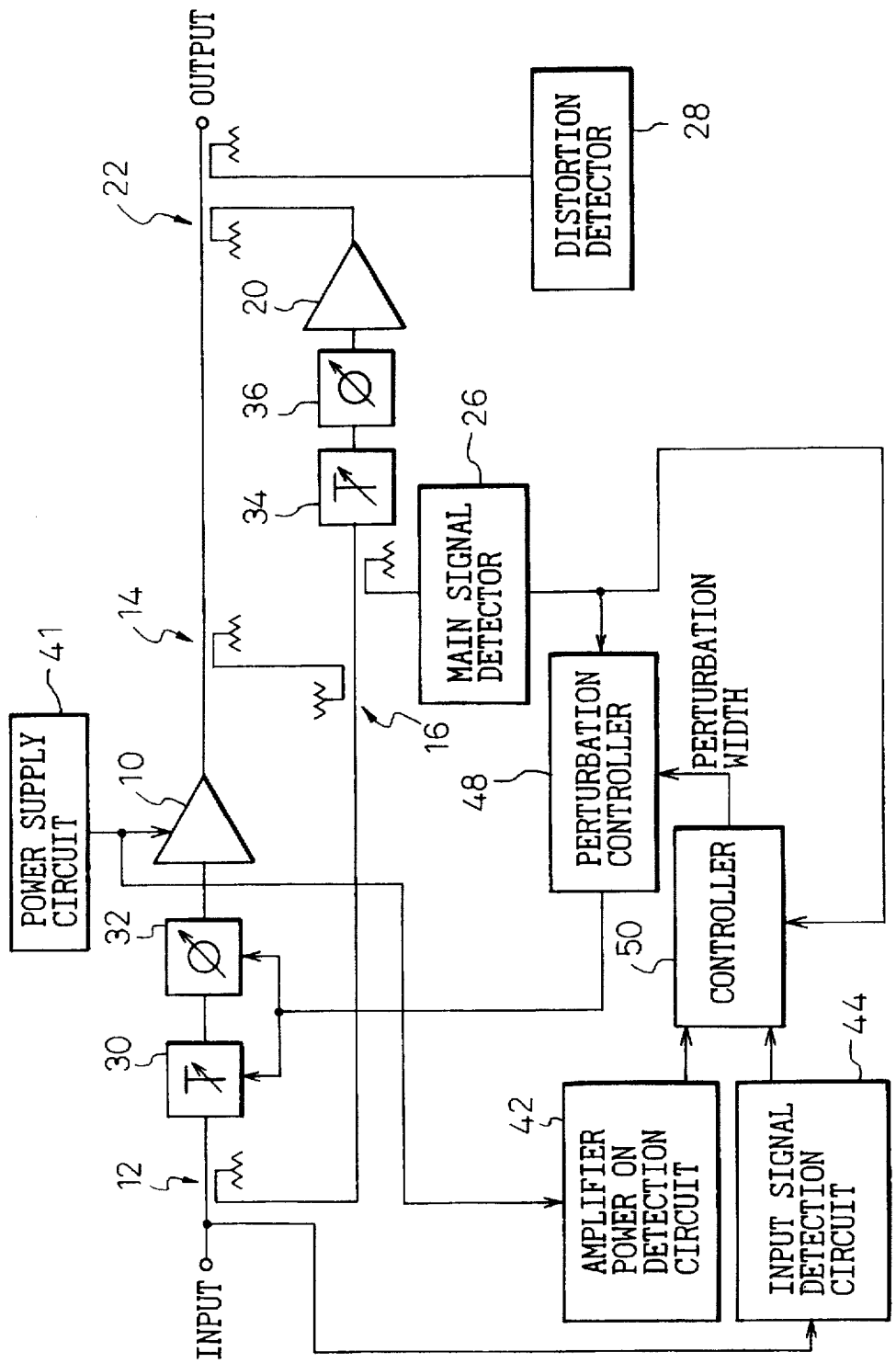
FIG. 8 is a block diagram showing a still further example of the feedforward amplifier of the present invention.

FIG. 8 is a block diagram showing a still further example of the feedforward amplifier of the present invention. The same component elements as those in FIG. 2 are designated by the same reference numerals. A perturbation controller 48, though not shown in either FIG. 2 or FIG. 7, is a block for adjusting the phase and amplitude in the distortion detection loop by the perturbation method in accordance with the output of the main signal detector 26. A controller 50 varies the perturbation width in the perturbation controller 48 in accordance with the detection outputs of the amplifier power ON detection circuit 42, the input signal detection circuit 44, and the main signal detector 26.

Figure 9:
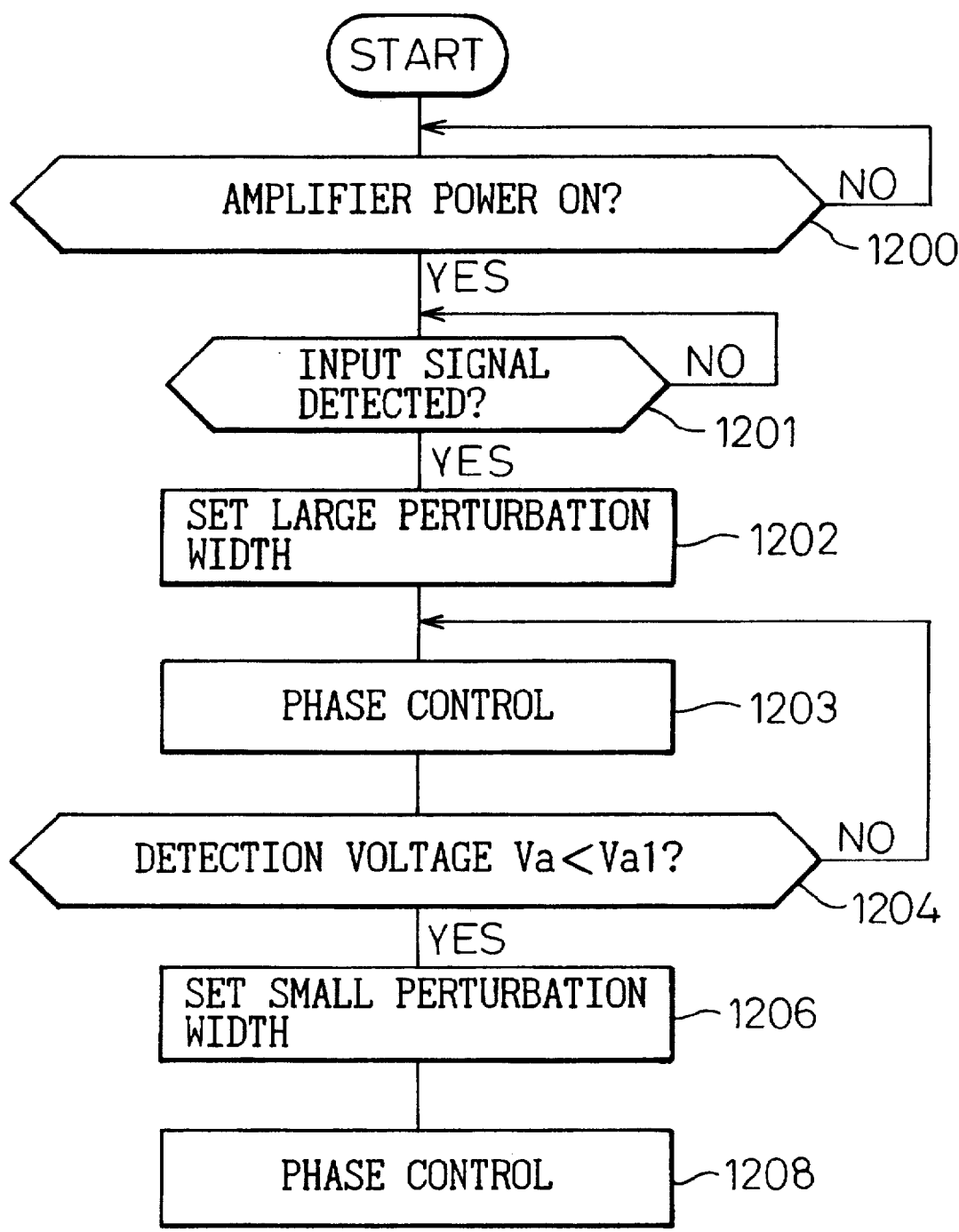
FIG. 9 is a flowchart illustrating the operation of a controller 50 in FIG. 8.

FIG. 9 is a flowchart illustrating the operation of the controller 50. In step 1200, it is determined, based on the output of the amplifier power ON detection circuit 42, whether the power to the amplifier 10 is ON or not. If it is determined that the power to the amplifier 10 is ON, then in step 1201 it is determined, based on the output of the input signal detection circuit 44, whether or not a signal is input to the amplifier 10. If it is determined that a signal is input to the amplifier 10, a large perturbation width is set in the perturbation controller 48 in step 1202. In this condition, the phase and amplitude are controlled by the perturbation method in step 1203. As the set values of the variable attenuator 30 and the variable phase shifter 32 approach their optimum values, detection voltage Va of the main signal detector 26 decreases. If the detection voltage Va drops below a threshold value Va1 in step 1204, then in step 1206 a small perturbation width is set in the perturbation controller 48, and with this value, the phase and amplitude are controlled in step 1208.

In this way, the perturbation width is set large until the amplitude and width approach their optimum values and the detection voltage Va drops below Va1; this permits the control to settle down quickly. Furthermore, as is apparent from FIG. 4, when the perturbation width is large, the change in the amount of cancellation is correspondingly large, making it possible to reduce the instability of control caused by modulation-induced input signal variations, noise, etc.

Figure 10:
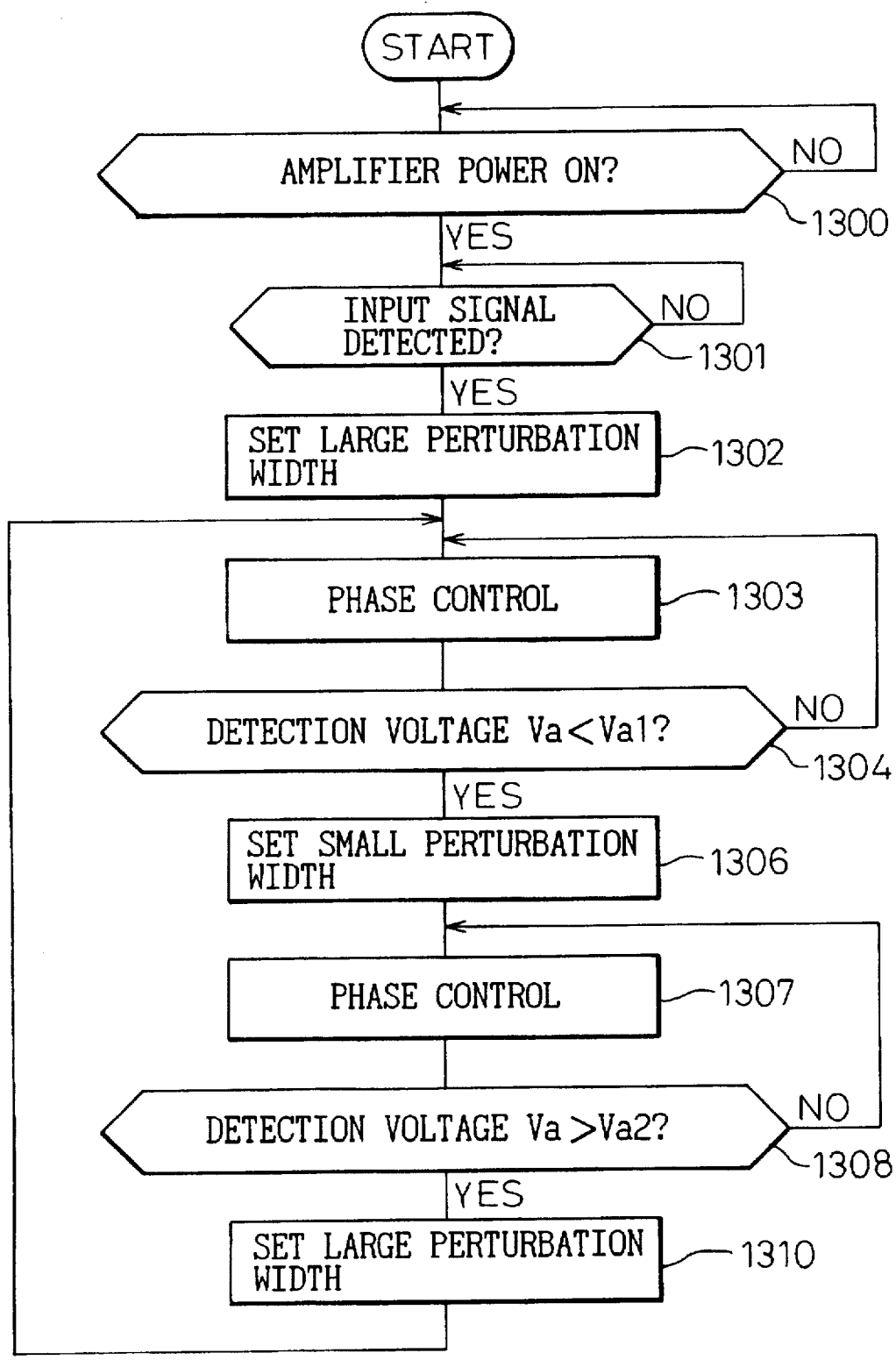
FIG. 10 is a flowchart illustrating the operation of the controller 50 in a yet further example of the feedforward amplifier of the present invention.

FIG. 10 is a flowchart illustrating the operation of the controller 50 in a yet further example of the feedforward amplifier of the present invention. The processing in steps 1300 to 1306 is the same as the processing in steps 1200 to 1206 in FIG. 9. After setting the perturbation width in the perturbation controller 48 to a small value in step 1306, it is determined in step 1308 whether or not the detection voltage Va is greater than a second threshold value Va2. If it is determined that Va is greater than Va2, then in step 1310 the perturbation width in the perturbation controller 48 is set back to a large value, after which the process returns to step 1304.

In the example of FIG. 10, if the center value of perturbation deviates from the best point for some reason in a steady-state condition, such deviation is detected and the perturbation width is changed accordingly. This serves to stabilize the loop control.

As described above, according to the present invention, the loop control can be optimized against the transient response behaviors of the control and variations in input signal level; this contributes to stable operation of the feedforward amplifier.

We claim:

1. A feedforward amplifier comprising:

an amplifier;

a distortion detection loop for combining a portion of an input to said amplifier with a portion of an output from said amplifier after adjusting the amplitude and phase of either one of them so that they are opposite in phase and equal in amplitude to each other with respect to a main signal, and for thereby outputting essentially only distortion generated by said amplifier, said distortion detection loop including a detector for detecting the main signal contained in the output thereof in order to adjust the amplitude and phase;

a distortion elimination loop for combining the output of said distortion detection loop with the other portion of the output from said amplifier after adjusting the amplitude and phase of either one of them so that they are opposite in phase and equal in amplitude to each other with respect to said distortion, and for thereby substantially eliminating the distortion from the output of said amplifier, said distortion eliminating loop including a detector for detecting loop equilibrium in order to adjust the amplitude and phase;

a variable attenuator placed in front of said detector in at least either one of said distortion detection and distortion elimination loops; and a control circuit for varying an amount of attenuation in said variable attenuator in accordance with a control condition of the corresponding loop.

2. A feedforward amplifier according to claim 1, wherein said control circuit first sets a first amount of attenuation in said variable attenuator and thereafter, when it is determined that the control of the corresponding loop has stabilized, then changes the amount of attenuation in said variable attenuator to a second amount of attenuation which is smaller than the first amount of attenuation.

3. A feedforward amplifier according to claim 2, wherein said control circuit sets the first amount of attenuation in said variable attenuator after power is turned on to said amplifier and, when a detection output of the corresponding detector drops below a first threshold value, then changes the amount of attenuation in said variable attenuator from the first amount of attenuation to the second amount of attenuation.

4. A feedforward amplifier according to claim 3, wherein when the second amount of attenuation is set in said variable attenuator, and when the output of the corresponding detector rises above a second threshold value, said control circuit changes the amount of attenuation in said variable attenuator from the second amount of attenuation to the first amount of attenuation.

5. A feedforward amplifier according to claim 1, wherein said control circuit continuously controls the amount of attenuation in said variable attenuator with a time constant slower than the time constant of the corresponding loop so that the output of said variable attenuator is maintained at a constant level.

6. A feedforward amplifier comprising:

an amplifier;

a distortion detection loop for combining a portion of an input to said amplifier with a portion of an output from said amplifier after adjusting the amplitude and phase of either one of them so that they are opposite in phase and equal in amplitude to each other with respect to a main signal, by varying the amplitude and phase of either one of them by a prescribed perturbation width and finding optimum values, and for thereby outputting essentially only distortion generated by said amplifier;

a distortion elimination loop for combining the output of the distortion detection loop with the other portion of the output from said amplifier after adjusting the amplitude and phase of either one of them so that they are opposite in phase and equal in amplitude to each other with respect to said distortion, by varying the amplitude and phase of either one of them by a prescribed perturbation width and finding optimum values, and for thereby substantially eliminating the distortion from the output of said amplifier; and a control circuit for varying the perturbation width in at least either one of said distortion detection and distortion elimination loops in accordance with a control condition of the loop.

7. A feedforward amplifier according to claim 6, wherein said control circuit first sets a first perturbation width and thereafter, when it is determined that the control of the corresponding loop has stabilized, then changes the perturbation width to a second perturbation width which is smaller than the first perturbation width.

8. A feedforward amplifier according to claim 7, wherein:

said distortion detection loop and said distortion elimination loop include a detector for detecting the main signal contained in the output thereof and a detector for detecting loop equilibrium, respectively, and said control circuit sets the first perturbation width after power is turned on to said amplifier and, when a detection output of the corresponding detector drops below a first threshold value, then changes the perturbation width in the corresponding loop from the first perturbation width to the second perturbation width.

9. A feedforward amplifier according to claim 8, wherein when the second perturbation width is set in the corresponding loop, and when the output of the corresponding detector rises above a second threshold value, said control circuit changes the perturbation width from the second perturbation width to the first perturbation width.

* * * * *